(12) United States Patent
Kim

(10) Patent No.: US 11,607,771 B2
(45) Date of Patent: Mar. 21, 2023

(54) WAFER PROCESSING APPARATUS

(71) Applicant: DISCO CORPORATION, Tokyo (JP)

(72) Inventor: Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 151 days.

(21) Appl. No.: 17/092,479

(22) Filed: Nov. 9, 2020

(65) Prior Publication Data

US 2021/0154794 A1 May 27, 2021

(30) Foreign Application Priority Data

Nov. 22, 2019 (JP) .............................. JP2019-211347

(51) Int. Cl.
*B24B 37/04* (2012.01)
*B24B 37/30* (2012.01)
*H01L 21/768* (2006.01)

(52) U.S. Cl.
CPC .............. *B24B 37/04* (2013.01); *B24B 37/30* (2013.01); *H01L 21/76898* (2013.01)

(58) Field of Classification Search
CPC ..... B24B 7/228; B24B 37/005; B24B 37/013; B24B 37/345; B24B 49/04; B24B 49/12
See application file for complete search history.

(56) References Cited

U.S. PATENT DOCUMENTS

| | | | | |
|---|---|---|---|---|
| 5,337,015 | A * | 8/1994 | Lustig | ................... B24B 37/013 |
| | | | | 324/688 |
| 9,953,407 | B2 * | 4/2018 | Ito | ...................... G01N 21/9501 |
| 2009/0017733 | A1 * | 1/2009 | Takahashi | ......... H01L 21/67161 |
| | | | | 451/65 |
| 2012/0252212 | A1 * | 10/2012 | Nishida | ............. H01L 21/30604 |
| | | | | 438/691 |
| 2013/0143413 | A1 * | 6/2013 | Sekiya | .............. H01L 21/31058 |
| | | | | 438/759 |

FOREIGN PATENT DOCUMENTS

| | | | |
|---|---|---|---|
| JP | 2013255952 A | 12/2013 | |
| KR | 20160119694 A | * 10/2016 | ............. H01L 21/72 |

OTHER PUBLICATIONS

Machine translation of KR-20160119694-A (Year: 2016).*

* cited by examiner

*Primary Examiner* — Joel D Crandall
*Assistant Examiner* — Robert F Neibaur
(74) *Attorney, Agent, or Firm* — Greer Burns & Crain, Ltd.

(57) ABSTRACT

A wafer processing apparatus includes a chuck table that holds a wafer with metal electrodes embedded therein, a processing unit that grinds or polishes the wafer held by the chuck table, a cassette mounting table for a cassette in which such wafers can be accommodated, a transfer unit that holds and transfers each wafer between the cassette and the chuck table, a checking unit configured to check whether or not at least one of the metal electrodes is exposed on the wafer, a notification unit that notifies that the at least one metal electrode is exposed, and a control unit that controls operations of the processing unit and the transfer unit. If the exposure of the at least one metal electrode on the wafer is detected by the checking unit, the control unit stops the processing of the wafer and the transfer of the wafer.

14 Claims, 7 Drawing Sheets

WAFER PROCESSING APPARATUS

BACKGROUND OF THE INVENTION

Field of the Invention

The present invention relates to a wafer processing apparatus that processes a wafer such as a silicon wafer.

Description of the Related Art

A wafer includes devices such as integrated circuits (ICs) or large-scale integrations (LSIs) formed on a front side thereof in regions defined by scheduled division lines (hereinafter called "streets"). By dividing the wafer along the streets, a plurality of device chips is manufactured including the devices therein. Further, packaging of pluralities of such device chips fabricates package devices having a desired function. These package devices are mounted in various kinds of electronic equipment typified by mobile phones or personal computers.

Reflecting a trend toward smaller and thinner electronic equipment in recent years, there is also an outstanding demand for thinner device chips and package devices. A method is therefore used to thin a wafer by applying grinding and polishing to a back side of the wafer before its division. For thinning a wafer, a wafer processing apparatus is used, which includes, for example, a chuck table that holds the wafer, a processing unit (grinding unit) on which a grinding wheel is fitted to grind the wafer, and another processing unit (polishing unit) to which a polishing pad is fitted to polish the wafer (refer, for example, to Japanese Patent Laid-Open 2013-255952).

In recent years, a technique has been put in practical use to stack a plurality of device chips and to connect them together by a metal electrode (through-silicon via (TSV)) extending in an up-and-down direction through the device chips. The use of this metal electrode enables to shorten the interconnection, which connects the device chips together, compared with the case that uses wire bonding or the like. It is hence possible to achieve downsizing and improvements in processing speed for package devices. For the manufacture of device chips with the above-described metal electrodes formed therein, a wafer is used in which metal electrodes connected to devices are embedded. This wafer is thinned to expose the metal electrodes on the back side of the wafer, and is then divided along streets, whereby the device chips are obtained with the metal electrodes extending therethrough.

SUMMARY OF THE INVENTION

If grinding or polishing is applied to a wafer with metal electrodes embedded therein and the metal electrodes are exposed, the metal electrodes come into contact with a grinding wheel or a polishing pad of a wafer processing apparatus, so that the metal, which constitutes the metal electrodes, scatters. If the scattered metal sticks the wafer, the stuck metal may be trapped as metal ions inside the wafer and may cause a failure in the operations of devices formed on the wafer. When exposing the metal electrodes from the wafer, a method is therefore used that first thins the wafer by grinding or polishing until shortly before the metal electrodes are exposed and then exposes the metal electrodes by using plasma etching or the like. In this manner, the contact of the metal electrodes with the grinding wheel or the polishing pad is avoided, thereby preventing scattering of the metal.

Due to variations in thickness of a wafer, variations in an amount of processing (an amount of grinding or an amount of polishing) of the wafer, variations in length (depth) of metal electrodes embedded in the wafer, or the like, one or more of the metal electrodes embedded in the wafer may, however, be unintentionally exposed on the wafer when ground or polished. If this becomes the case, the one or more metal electrodes and the grinding wheel or the polishing pad come into contact with each other, the metal sticks the grinding wheel, the polishing pad, the wafer and the like and in addition the metal scatters inside the wafer processing apparatus.

If the operation of the wafer processing apparatus (the processing, transfer or the like of the wafer) is continued with the one or more metal electrodes exposed on the wafer, a scattered amount of the metal increases, and in addition, the metal is carried by a transfer unit (transfer mechanism) included in the wafer processing apparatus, and the metal may spread throughout an interior of the wafer processing apparatus. Therefore, contamination of the wafer and the wafer processing apparatus with the metal may occur. If a wafer with a large amount of the metal stuck thereon is transferred to another processing apparatus, the processing apparatus as the destination of the transfer may also be contaminated with the metal. If the metal sticks inside the wafer processing apparatus, a need arises for a large-scale overhaul to rinse the wafer processing apparatus after disassembling it to a component level. As a result, enormous labor and cost are consumed for the maintenance of the wafer processing apparatus, and therefore the processing efficiency of wafers is also reduced.

With such problems in view, the present invention has as an object thereof the provision of a wafer processing apparatus that can suppress scattering and spreading of a metal inside the wafer processing apparatus.

In accordance with an aspect of the present invention, there is provided a wafer processing apparatus including a chuck table that holds one of a plurality of wafers in each of which metal electrodes are embedded, a processing unit that grinds or polishes the wafer held by the chuck table, a cassette mounting table on which a cassette, in which the plurality of wafers is capable of being accommodated, is mounted, a transfer unit that holds and transfers each wafer between the cassette and the chuck table, a checking unit configured to check whether or not at least one of the metal electrodes is exposed on the wafer, a notification unit that notifies that the at least one metal electrode is exposed, and a control unit that controls operations of the processing unit and the transfer unit. The control unit is configured so that, if the exposure of the at least one metal electrode on the wafer is detected by the checking unit, the control unit stops the processing of the wafer by the processing unit and the transfer of the wafer by the transfer unit and controls the notification unit to notify the exposure of the at least one metal electrode on the wafer.

Preferably, the checking unit may be configured to check the wafer held by the chuck table. Preferably, the checking unit may be configured to check the wafer held by the transfer unit. Preferably, the wafer processing apparatus may further include a determination unit, the checking unit may be connected to the determination unit and may include a camera configured to image the wafer, and the determination unit may be configured to determine, based on an image of the wafer as acquired by the camera, whether or not the at least one metal electrode is exposed.

The wafer processing apparatus according to the aspect of the present invention includes the checking unit configured to check whether or not the at least one metal electrode is exposed on the wafer, and the control unit that controls operation of a constituent part (the processing unit, the transfer unit, or the like) of the wafer processing apparatus. If the exposure of the at least one metal electrode on the wafer is detected by the checking unit, the control unit stops the processing, transfer or the like by the corresponding constituent part of the wafer processing apparatus. Use of the above-described wafer processing apparatus can suppress scattering of the metal, which constitutes at least one metal electrode, and spreading of the metal inside the wafer processing apparatus even if the at least one metal electrode is unintentionally exposed by the processing of the wafer. Therefore, the contamination of the wafer and the wafer processing apparatus is prevented, and at the same time the labor and cost required for the maintenance of the wafer processing apparatus are reduced.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
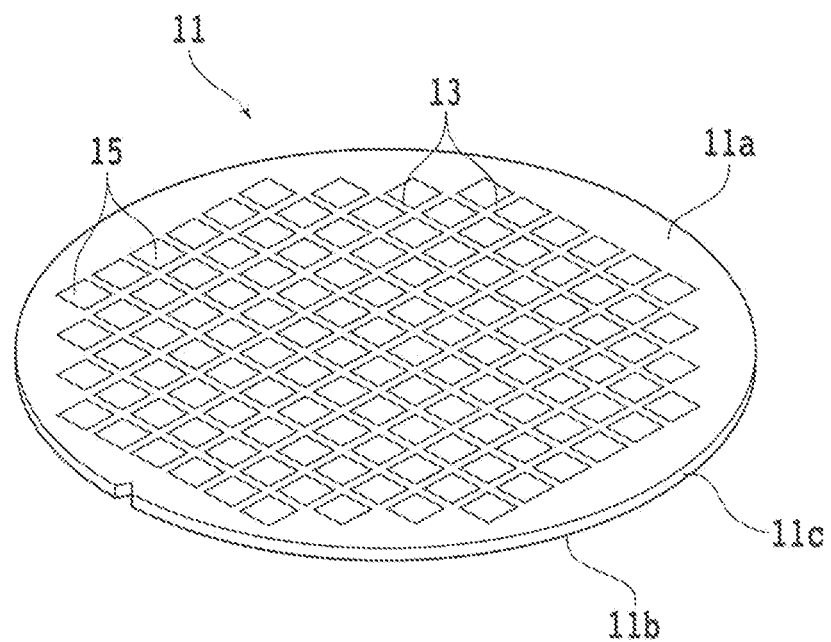
FIG. 1A is a perspective view depicting a wafer.

With reference to the attached drawings, an embodiment of the present invention will hereinafter be described. First, a description will be made regarding a configuration example of a wafer that can be processed by a wafer processing apparatus according to the present embodiment. FIG. 1A is a perspective view depicting a wafer 11.

The wafer 11 is, for example, a silicon wafer formed in a disc shape, and includes a front side 11a, a back side 11b, and an outer peripheral edge 11c connected to the front side 11a and the back side 11b. The wafer 11 is defined in a plurality of regions by a plurality of streets 13 that is arrayed in a grid pattern to intersect one another, and on the front side 11a of the regions, devices 15 such as ICs or LSIs are formed, individually. No limitations are imposed on the material, shape, structure, size and the like of the wafer 11. For example, the wafer 11 may be formed with a material such as a non-silicon semiconductor (GaAs, InP, GaN, SiC or the like), glass, ceramics, resin, or metal. Further, no limitations are imposed on either the kind, number, shape, structure, size, arrangement or the like of the devices 15.

Figure 1B:
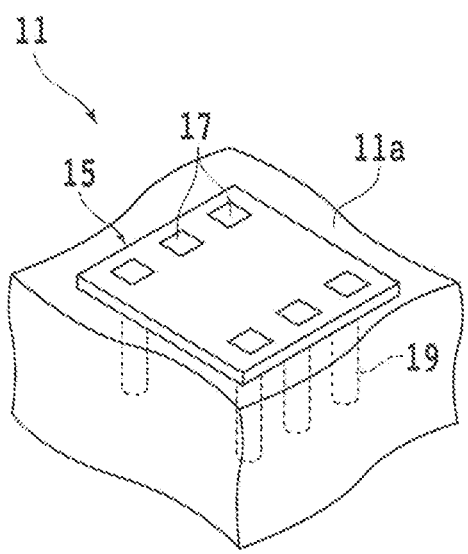
FIG. 1B is a perspective view depicting a portion of the wafer on an enlarged scale.

FIG. 1B is a perspective view depicting a portion of the wafer 11 on an enlarged scale. The devices 15 are provided with a plurality of connection electrodes 17. The plurality of connection electrodes 17 are exposed at surfaces of devices 15 and to be connected to other interconnections, electrodes, devices and/or the like. Inside each of the regions defined by the streets 13, columnar metal electrodes (via electrodes or through electrodes) 19 are formed. The metal electrodes 19 are embedded along the thickness direction of the wafer 11 and are connected to the corresponding device 15. For example, the metal electrodes 19 are connected to the connection electrodes 17, individually. The metal electrodes 19 are each disposed extending from the device 15 toward the back side 11b of the wafer 11 and each has a height smaller than the thickness of the wafer 11. Therefore, the metal electrodes 19 are not exposed on the back side 11b of the wafer 11 and are in a state in which the metal electrodes 19 are embedded in the wafer 11. No limitation is imposed on the material of the metal electrodes 19. For example, the metal electrodes 19 are formed with copper, tungsten, aluminum or the like.

By dividing the wafer 11 along the streets 13, a plurality of device chips is obtained. These device chips each includes the device 15 and the metal electrodes 19 connected to the device 15. For dividing the wafer 11, a cutting apparatus is used, for example. The cutting apparatus includes a chuck table which holds the wafer 11, and a spindle (rotating shaft) on which an annular cutting blade is fitted to cut the wafer 11. When the spindle is rotated with the cutting blade fitted on a distal end portion of the spindle, the cutting blade rotates. With the wafer 11 held by the chuck table of the cutting apparatus, the cutting blade is rotated, thereby causing the cutting blade to cut into the wafer 11 sequentially along each street 13. By doing so, the wafer 11 is cut and divided into the device chips.

Before or after the division of the wafer 11, grinding and polishing is applied to the back side 11b of the wafer 11 so that the wafer is thinned to expose the metal electrodes 19 on the back side 11b of the wafer 11. Therefore, the devices 15 formed on the wafer 11 are connectable via the metal electrodes 19 to other devices disposed on the back side 11b of the wafer 11. The metal electrodes 19 function as through electrodes to connect the stacked devices together when manufacturing package devices each of which includes device chips stacked together.

Figure 2:
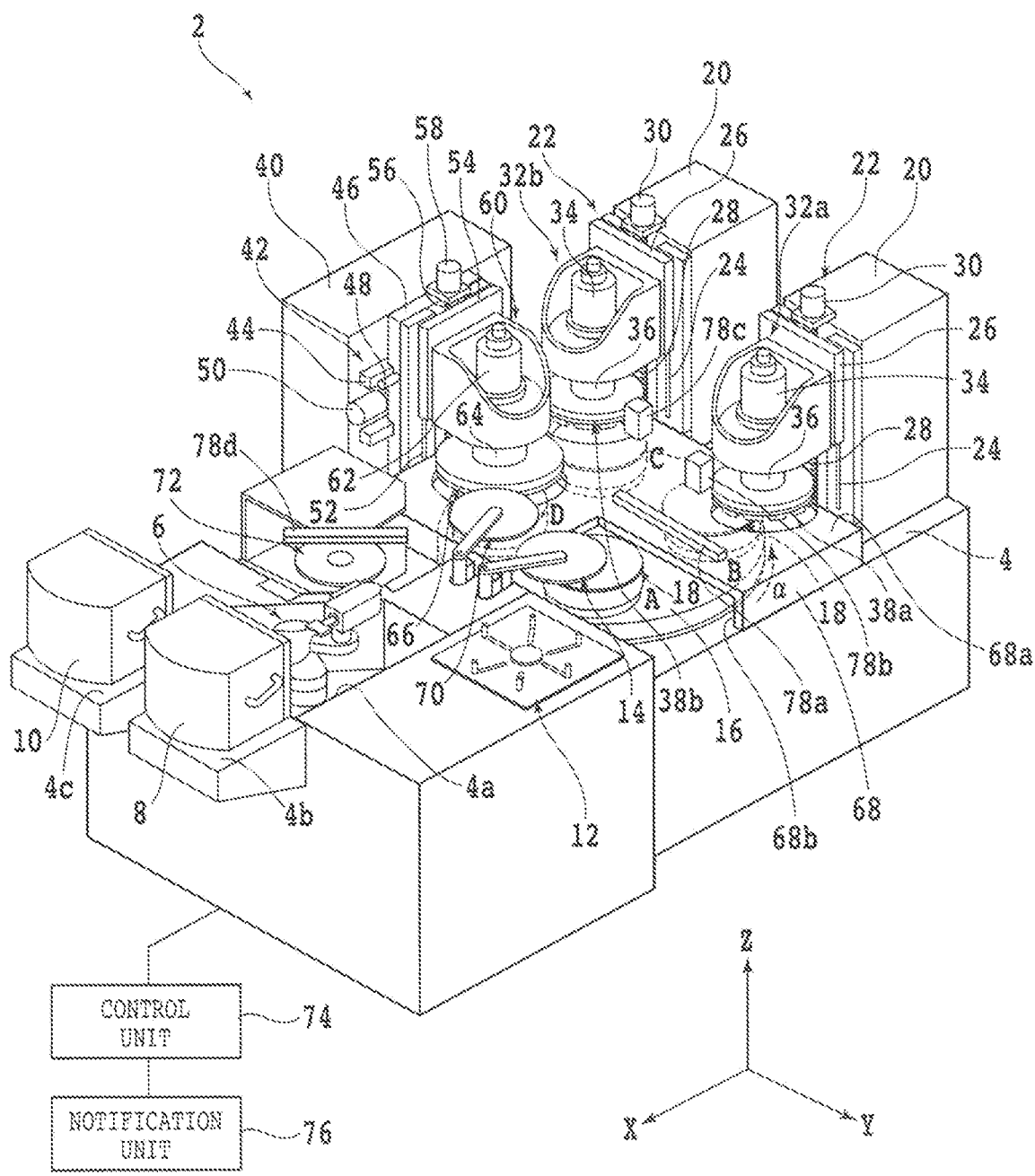
FIG. 2 is a perspective view depicting a wafer processing apparatus.

To thin the wafer 11, a wafer processing apparatus is used that can apply, for example, grinding and polishing to the wafer 11. FIG. 2 is a perspective view of a wafer processing apparatus 2.

The wafer processing apparatus 2 includes a bed 4 to support individual constituent parts that configure the wafer processing apparatus 2. An opening 4a is formed on a side of a front edge of an upper wall of the bed 4, and in the opening 4a, a transfer unit (transfer mechanism) 6 is arranged to transfer the wafer 11. In a further front region of the opening 4a, cassette mounting tables 4b and 4c are arranged. On the cassette mounting table 4b, a cassette 8 that can accommodate a plurality of wafers 11 is mounted. On the cassette mounting table 4c, a cassette 10 that can accommodate a plurality of wafers 11 is mounted.

In oblique rear of the opening 4a, a registration mechanism (alignment mechanism) 12 is arranged. The registration mechanism 12 disposes the wafer 11, which has been transferred (unloaded) from the cassette 8 by the transfer unit 6, in registration with a predetermined position. At a position adjacent the registration mechanism 12, a transfer unit (transfer mechanism) 14 is arranged. The transfer unit 14 turns with the wafer 11 held thereon. The transfer unit 14 includes, on a side of a lower surface thereof, a suction pad to suction the front side of the wafer 11 and transfers the wafer 11, which has been subjected to a positional registration by the registration mechanism 12, rearward with the wafer 11 held thereon.

In rear of the transfer unit 14, a disc-shaped turn table 16 is arranged. The turn table 16 is connected to a rotary drive source (not depicted) such as an electric motor and rotates about an axis of rotation that is substantially parallel to a Z-axis direction (vertical direction or up-and-down direction). On an upper surface of the turn table 16, four chuck tables (holding tables) 18 are disposed at substantially equal angular intervals to hold the wafers 11. No limitation is, however, imposed on the number of the chuck tables 18 disposed on the turn table 16. The turn table 16 rotates counterclockwise (in a direction indicated by an arrow a) as viewed in plan and positions each chuck table 18 in a transfer station A, a coarse grinding station B, a finish grinding station C, a polishing station D, and the transfer station A in this order.

The chuck tables 18 are each connected to a rotary drive source (not depicted) such as an electric motor and each rotates about an axis of rotation that is generally parallel to the Z-axis direction. The transfer unit 14 holds the wafer 11, which is placed on the registration mechanism 12, under suction by the suction pad and transfers it to the chuck table 18 positioned in the transfer station A.

The chuck table 18 configures at an upper surface thereof a holding surface that holds the wafer 11. The holding surface of the chuck table 18 is connected to a suction source (not depicted) such as a vacuum ejector via a flow passage (not depicted) formed inside the chuck table 18. If the wafer 11 is placed on the chuck table 18 and a negative pressure is applied from the suction source to the holding surface of the chuck table 18, the wafer 11 is held under suction by the chuck table 18.

In rear of the coarse grinding station B and in rear of the finish grinding station C (in rear of the turn table 16), columnar support structures 20 are disposed, individually. On a side of a front surface of each support structure 20, a Z-axis moving mechanism 22 is arranged. The Z-axis moving mechanism 22 includes a pair of Z-axis guide rails 24 disposed substantially in parallel to the Z-axis direction, and a square Z-axis moving plate 26 is slidably fitted on the paired Z-axis guide rails 24. On a side of a rear surface (on a side of a back surface) of the Z-axis moving plate 26, nut portions (not depicted) are arranged, and a Z-axis ball screw 28 disposed substantially in parallel to the Z-axis guide rails 24 is arranged in threaded engagement with the nut portions. A Z-axis pulse motor 30 is connected to one end portion of the Z-axis ball screw 28. If the Z-axis ball screw 28 is rotated by the Z-axis pulse motor 30, the Z-axis moving plate 26 moves in the Z-axis direction along the Z-axis guide rails 24.

On a side of a forward surface (on a side of a front surface) of the Z-axis moving plate 26 disposed above the coarse grinding station B, a processing unit (grinding unit) 32*a* is arranged to perform coarse grinding of the wafer 11. On a side of a forward surface (on a side of a front surface) of the Z-axis moving plate 26 disposed above the finish grinding station C, on the other hand, a processing unit (grinding unit) 32*b* is arranged to perform finish grinding of the wafer 11. The processing units 32*a* and 32*b* each includes a cylindrical housing 34 fixed on the associated Z-axis moving plate 26. A spindle 36 which configures a rotating shaft is rotatably accommodated in the housing 34, and the spindle 36 is exposed from the housing 34 at a lower end portion (distal end portion) thereof.

On the lower end portion of the spindle 36 included in the processing unit 32*a*, a grinding wheel 38*a* is fitted to perform coarse grinding of the wafer 11. On the lower end portion of the spindle 36 included in the processing unit 32*b*, on the other hand, a grinding wheel 38*b* is fitted to perform finish grinding of the wafer 11. The grinding wheels 38*a* and 38*b* each includes a cylindrical hub formed with a metal material such as aluminum or stainless steel. On a side of a lower surface of the hub, a plurality of rectangular prism grinding stones is arrayed in a circle along an outer periphery of the hub. The grinding stones are formed, for example, by fixing abrasive grains, which are made of diamond, cubic boron nitride (cBN) or the like, with an adhesive such as a metal bond, resin bond, or vitrified bond. No limitations are imposed on the material, shape, structure, size and the like of the grinding stones, and the number of grinding stones to be included in the grinding wheel 38*a* or 38*b* can be set as desired. However, the abrasive grains of the grinding stones included on the grinding wheel 38*b* have an average grain size smaller than that of the abrasive grains of the grinding stones included on the grinding wheel 38*a*.

To a side of an upper end (on a side of a proximal end) of each spindle 36, a rotary drive source (not depicted) such as an electric motor is connected, and the associated grinding wheel 38*a* or 38*b* is rotated by a force transmitted from the rotary drive source. Inside each processing unit 32*a* or 32*b*, a grinding fluid supply path (not depicted) is arranged to supply a grinding fluid such as pure water. The grinding fluid is supplied toward the wafer 11 when grinding is applied to the wafer 11.

The wafer 11, which has been transferred onto the chuck table 18 positioned in the transfer station A, is ground by the processing units 32*a* and 32*b*. Described specifically, the chuck table 18 with the wafer 11 held thereon is first positioned in the coarse grinding station B by rotation of the turn table 16. With the chuck table 18 and the grinding wheel 38*a* kept rotating, the processing unit 32*a* is then controlled to descend so that the grinding stones included on the grinding wheel 38*a* are brought into contact with an upper surface (the back side 11*b*) of the wafer 11. Therefore, coarse grinding is applied to a side of the upper surface of the wafer 11. The chuck table 18 with the wafer 11 held thereon, the wafer 11 having been subjected to the coarse grinding, is next positioned in the finish grinding station C by rotation of the turn table 16. With the chuck table 18 and the grinding wheel 38*b* kept rotating, the processing unit 32*b* is then controlled to descend so that the grinding stones included on the grinding wheel 38*b* are brought into contact with the side of the upper surface of the wafer 11. Therefore, finish grinding is applied to the side of the upper surface of the wafer 11.

Laterally of the polishing station D (laterally of the turn table 16), a columnar support structure 40 is disposed. On a side of an inner surface of the support structure 40 (on a side of the turn table 16), an X-Z axis moving mechanism 42 is arranged. The X-Z axis moving mechanism 42 includes a pair of first guide rails 44 disposed substantially in parallel to the X-axis direction, and a rectangular first moving plate 46 is slidably fitted on the paired first guide rails 44. On the side of an outer surface of the first moving plate 46, nut portions (not depicted) are arranged, and a first ball screw 48 is disposed substantially in parallel to the first guide rails 44 and is maintained in threaded engagement with the nut portions. A first pulse motor 50 is connected to one end portion of the first ball screw 48. If the first ball screw 48 is rotated by the first pulse motor 50, the first moving plate 46 moves in the X-axis direction along the first guide rails 44.

On a side of an inner surface (on a side of the turn table 16) of the first moving plate 46, a pair of second guide rails 52 is arranged substantially in parallel to the Z-axis direction. A square second moving plate 54 is slidably fitted on the paired second guide rails 52. On a side of an outer surface of the second moving plate 54, nut portions (not depicted) are arranged, and a second ball screw 56 is disposed substantially in parallel to the second guide rails 52 and is maintained in threaded engagement with the nut portions. A second pulse motor 58 is connected to one end portion of the second ball screw 56. If the second ball screw 56 is rotated by the second pulse motor 58, the second moving plate 54 moves in the Z-axis direction along the second guide rails 52. On a side of an inner surface (on a side of the turn table 16) of the second moving plate 54, a processing unit (polishing unit) 60 is arranged to polish the wafer 11.

The processing unit 60 includes a cylindrical housing 62 fixed on the second moving plate 54. A spindle 64 which configures a rotating shaft is rotatably accommodated in the housing 62, and the spindle 64 is exposed from the housing 62 at a lower end portion thereof. To a lower end portion of the spindle 64, a disc-shaped polishing pad 66 is attached to polish the wafer 11. To a side of an upper end (on a side of a proximal end) of the spindle 64, a rotary drive source (not depicted) such as an electric motor is connected, and the polishing pad 66 is rotated by a force transmitted from the rotary drive source. Inside the processing unit 60, a polishing fluid supply path (not depicted) is arranged to supply a polishing fluid. The polishing fluid is supplied toward the wafer 11 when polishing is applied to the wafer 11.

The polishing pad 66 includes a polishing layer that comes into contact with the wafer 11 to polish the wafer 11. The polishing layer has been formed, for example, by dispersing abrasive grains as fixed abrasive grains in a nonwoven fabric or foamed urethane strip. A usable example of the abrasive grains can be silica having a grain size of approximately 0.1 μm or greater and 10 μm or smaller. The grain size, material and the like of the abrasive grains are, however, changed as needed depending on the material and the like of the wafer 11.

If abrasive grains are included in the polishing layer, a polishing fluid that contains no abrasive grains is used. As the polishing fluid, it is possible to use, for example, an alkaline solution with sodium hydroxide, potassium hydroxide or the like dissolved therein or an acidic solution of a permanganate salt or the like. Further, pure water can also be used as a polishing fluid. On the other hand, the polishing layer may be free of abrasive grains. If this is the case, a chemical solution (slurry) with abrasive grains (free abrasive grains) dispersed therein is supplied as a polishing fluid. The materials of the chemical solution, the material of the abrasive grains, the grain size of the abrasive grains and the like are selected as desired according to the material and the like of the wafer 11. When polishing the wafer 11, no polishing fluid may be supplied to the wafer 11 and the polishing pad 66. If this is the case, the wafer 11 is processed by dry polishing.

The wafer 11, which has been ground by the processing units 32*a* and 32*b*, is then polished by the processing unit 60. Described specifically, the chuck table 18 with the wafer 11 held thereon is first positioned in the polishing station D by rotation of the turn table 16. With both the chuck table 18 and the polishing pad 66 kept rotating, the processing unit 60 is then controlled to descend so that the polishing layer included in the polishing pad 66 is brought into contact with an upper surface (the back side 11*b*) of the wafer 11. As a consequence, the wafer 11 is polished on a side of the upper surface thereof.

Further, a box-shaped cover 68 is arranged on the bed 4. The cover 68 is disposed covering the turn table 16 and the chuck tables 18 positioned in the coarse grinding station B, the finish grinding station C, and the polishing station D. Owing to the arrangement of the cover 68, it is possible to prevent scattering of debris particles (swarf), which occur by processing, and the processing fluid (grinding fluid or polishing fluid). On a side of an upper surface 68*a* of the cover 68, a plurality of circular openings is formed. In these circular openings, the processing units 32*a* and 32*b* are inserted on sides of lower ends thereof and the processing unit 60 is inserted on a side of a lower end thereof. Owing to these openings, the processing units 32*a* and 32*b* and the processing unit 60 are avoided from contact with the cover 68. An opening 68*b* is also arranged on a side of a lower surface of the cover 68. The chuck table 18 is inserted in the opening 68*b*. If the turn table 16 rotates, the chuck table 18 positioned in the transfer station A is successively positioned in the coarse grinding station B, the finish grinding station C, and the polishing station D in this order inside the opening 68*b* and is then positioned in the transfer station A again.

At a position adjacent the transfer unit 14, a transfer unit (transfer mechanism) 70 is arranged. The transfer unit (transfer mechanism) 70 turns while holding the wafer 11 that has been processed by the processing units 32*a* and 32*b* and the processing unit 60. The transfer unit 70 includes on a side of a lower surface thereof a suction pad that sucks the wafer 11 at the side of the upper surface thereof, and while holding the wafer 11 placed on the chuck table 18 positioned in the transfer station A, transfers the wafer 11 forward.

On a forward side of the transfer unit 70 and on a rear side of the opening 4*a*, a rinsing unit (rinsing system) 72 is disposed to rinse the wafer 11 transferred by the transfer unit 70. The wafer 11, which has been rinsed by the rinsing unit 72, is transferred by the transfer unit 6 and is accommodated in the cassette 10.

The individual constituent parts (the transfer unit 6, the registration mechanism 12, the transfer unit 14, the turn table 16, the chuck table 18, the Z-axis moving mechanism 22, the processing units 32*a* and 32*b*, the X-Z axis moving mechanism 42, the processing unit 60, the transfer unit 70, the rinsing unit 72, and the like), which configure the wafer processing apparatus 2, are each connected to a control unit 74 configured by a computer or the like. Operations of the individual constituent parts are controlled by the control unit 74.

To the control unit 74, a notification unit 76 is connected to notify an operator of predetermined information. The notification unit 76 is configured, for example, by an alarm lamp lighting of which is controlled by the control unit 74, a display that can present the predetermined information, or the like.

By the above-described wafer processing apparatus 2, grinding and polishing of the wafer 11 is performed. For example, the wafer 11 depicted in FIGS. 1A and 1B is ground and polished on the back side 11*b* thereof, and therefore the wafer 11 is thinned. Here, if one or more of the metal electrodes 19 (see FIG. 1B) are exposed on the back side 11*b* of the wafer 11 through processing of the wafer 11, in which the metal electrodes 19 are embedded, on the back side 11b thereof by the wafer processing apparatus 2, the metal electrodes 19 come into contact with the grinding wheels 38a and 38b and the polishing pad 66, so that the metal, which forms the one or more metal electrodes, scatters around. If the scattered metal sticks the wafer 11, metal ions may be trapped in the wafer 11 and may cause a failure in the operations of the devices 15 formed on the wafer 11. Therefore, when exposing the metal electrodes 19, the wafer 11 is first processed and thinned by the wafer processing apparatus 2 until shortly before the metal electrodes 19 are exposed, and then the metal electrodes 19 are exposed using plasma etching or the like. By doing so, the contact between the grinding wheels 38a and 38b and the polishing pad 66 and the metal electrodes 19 is avoided, thereby preventing the scattering of the metal.

However, an amount of grinding and an amount of polishing of the wafer 11 may become greater than preset values due to processing variations or the like of the wafer 11. In addition, all or some of the metal electrodes 19 embedded in the wafer 11 may be formed longer than expected, or some of the metal electrodes 19 may be formed long locally. If grinding or polishing is applied to the wafer 11 in such a case, the all or some of the metal electrodes 19 embedded in the wafer 11 may be unintentionally exposed on the wafer 11. If this becomes the case, the metal electrodes 19 and the grinding wheels 38a and 38b and polishing pad 66 come into contact with each other, the metal sticks the grinding wheels 38a and 38b, the polishing pad 66, the wafer 11 and the like, and, in addition, swarf formed of the metal scatters inside the wafer processing apparatus 2. If the operation of the wafer processing apparatus 2 (the processing, transfer and the like of the wafer 11) is continued with the all or some of the metal electrodes 19 exposed on the wafer 11, the scattered amount of the metal increases, and, in addition, the metal is carried by a transfer unit or the like included in the wafer processing apparatus 2, and the metal may spread throughout the interior of the wafer processing apparatus 2. If this is the case, a need arises for a large-scale overhaul to rinse the wafer processing apparatus 2 after disassembling it to a component level. As a result, enormous labor and cost are consumed for the maintenance of the wafer processing apparatus 2, and therefore the processing efficiency of wafers 11 is also reduced.

Therefore, the wafer processing apparatus 2 according to the present embodiment includes a checking unit (checking means) to check whether or not at least one of the metal electrodes 19 (hereinafter simply called "at least one metal electrode 19") is exposed on the wafer 11. If the exposure of at least one metal electrode 19 on the wafer 11 is detected by the checking unit, the processing of the wafers 11 by the processing units 32a and 32b and the processing unit 60, and the transfer of the wafers 11 by the transfer units 6, 14, and 70 are then stopped. By doing so, the scattering of the metal, which constitutes the at least one metal electrode 19, and the spreading of the metal inside the wafer processing apparatus 2 are suppressed.

In the wafer processing apparatus 2 depicted in FIG. 2, four checking units (checking means) 78a, 78b, 78c, and 78d are arranged. The checking units 78a, 78b, 78c, and 78d each checks whether or not at least one metal electrode 19 is exposed on the wafer 11. The checking units 78a, 78b, 78c, and 78d each includes, for example, a camera (imaging unit) that images the wafer 11, and a determination unit that based on an image of the wafer 11 as acquired by the camera, determines whether or not at least one metal electrode 19 is exposed.

Each camera images the wafer 11 to acquire an image of the wafer 11. The image of the wafer 11 as acquired by the camera is then outputted to the determination unit. If at least one metal electrode 19 is exposed on the wafer 11, a difference arises in density between a region, where the at least one metal electrode 19 is exposed, and the remaining region, where no metal electrode 19 is exposed, in the image acquired by the camera. The determination unit then applies, for example, predetermined image processing to the image of the wafer 11, and based on the density of the image, determines whether or not at least one metal electrode 19 is exposed. By pattern matching using the image acquired by the camera and a reference image presenting the wafer 11 in a state that no metal electrode 19 is exposed, for example, the determination unit determines whether or not at least one metal electrode 19 is exposed. As an alternative, the determination unit may binarize the image, which has been acquired by the camera, into white pixels and black pixels, and based on the presence or absence or the area of the black pixels or white pixels, may determine whether or not at least one metal electrode 19 is exposed. As another alternative, the determination unit may make the density of the image captured by the camera multivalued, and through a comparison between pieces of data, which indicate a gradation of the image, and a preset threshold, may determine whether or not at least one metal electrode 19 is exposed. If such processing is performed, the determination unit also functions as an image processing unit.

Further, each determination unit may also include a light source that irradiates light toward the wafer 11 to illuminate the wafer 11 when imaging the wafer 11 by the camera. The light source may be configured to enable irradiation of a plurality of light rays having different wavelengths. For example, the light source irradiates two kinds of light rays (first light and second light) having different wavelengths. If the wavelength of light to be irradiated to the wafer 11 changes, the transmittance of the light through the wafer 11 changes so that the amount of light to be received by the camera changes. Therefore, the sensitivity of the imaging to the thickness of the back side 11b of the wafer 11 (the distance from the back side 11b of the wafer 11 to the metal electrodes 19) is adjusted, leading to a change in the thickness of the back side 11b of the wafer 11, the thickness being required to display at least one metal electrode 19 in an image to be acquired by the camera. As a result, the condition for the detection of the exposure of at least one metal electrode 19 is changed. For example, the wavelength of the first light is set so that each metal electrode 19 is displayed in an image if the distance from the back side 11b of the wafer 11 to a tip of the metal electrode 19 is 10 μm or smaller. On the other hand, the wavelength of the second light is set so that each metal electrode 19 is displayed in the image if the distance from the back side 11b of the wafer 11 to the tip of the metal electrode 19 is 5 μm or smaller. However, the number and wavelengths of light rays to be irradiated from the light source are not limited, but can be set as desired.

The above-described determination unit may be a section of the control unit 74 or may be configured separately from the control unit 74. If the determination unit is arranged independently of the control unit 74, the determination unit is connected to the control unit 74. Results of the checking by the checking units 78a, 78b, 78c, and 78d, specifically pieces of information regarding whether or not at least one metal electrode is exposed on the wafer 11 are outputted to the control unit 74.

No limitations are imposed on the configuration and function of the checking units 78a, 78b, 78c, and 78d, insofar as they can check whether or not at least one metal electrode 19 is exposed on the wafer 11. For example, each checking unit 78a, 78b, 78c, or 78d may irradiate a laser beam toward the wafer 11 and, based on a difference between the intensity of the laser beam reflected by the wafer 11 and the intensity of the laser beam reflected by at least one metal electrode 19, may then determine whether or not the at least one metal electrode 19 is exposed on the wafer 11.

If the exposure of at least one metal electrode 19 on the wafer 11 is detected by the checking unit 78a, 78b, 78c, or 78d, the control unit 74 discontinues the operation of the wafer processing apparatus 2. Described specifically, the control unit 74 controls the operations of the individual constituent parts (the transfer unit 6, the registration mechanism 12, the transfer unit 14, the turn table 16, the chuck tables 18, the Z-axis moving mechanism 22, the processing units 32a and 32b, the X-Z axis moving mechanism 42, the processing unit 60, the transfer unit 70, the rinsing unit 72, and the like) of the wafer processing apparatus 2 and stops the processing, transfer and the like of wafers 11.

The constituent part or parts, the processing, transfer or the like by each of which is to be stopped by the control unit 74, can be selected as needed. For example, the control unit 74 can select one or more constituent parts among the processing units 32a and 32b, the processing unit 60, and the transfer units that transfer the wafers 11 between the cassettes 8 and 10 and the chuck table 18, specifically the transfer units 6, 14, and 70 to stop the processing, transfer and/or the like by such one or more constituent parts. Described specifically, if the exposure of at least one metal electrode 19 on the wafer 11 is detected, the control unit 74 controls the paired Z-axis moving mechanisms 22 and the X-Z axis moving mechanism 42 to cause the processing units 32a and 32b and the processing unit 60 to ascend instantaneously. As a consequence, the grinding wheels 38a and 38b and the polishing pad 66 move away from the wafers 11, whereby the processing of the wafers 11 by the processing units 32a and 32b and the processing unit 60 is stopped. In addition, the control unit 74 also controls the transfer units 6, 14, and 70 to stop the transfer of the wafers 11.

Moreover, the control unit 74 also controls the notification unit 76 to notify the result of the checking by the checking unit. Described specifically, if the exposure of at least one metal electrode 19 is detected by one of the checking units 78a, 78b, 78c, and 78d, the control unit 74 controls the operation of the notification unit 76 so that the notification unit 76 notifies the exposure of the at least one metal electrode 19 on the wafer 11. If the notification unit 76 is an alarm lamp, for example, the control unit 74 turns on the alarm lamp. If the notification unit 76 is a display, on the other hand, the control unit 74 controls the display to present to the effect that the at least one metal electrode 19 is exposed.

The checking unit 78a is disposed above the chuck tables 18 and at a position that overlaps a region between the transfer station A and the coarse grinding station B. While the chuck table 18 with the wafer 11 held thereon is moving from the transfer position A toward the coarse grinding position B, the checking unit 78a observes the wafer 11 and checks whether or not at least one metal electrode 19 is exposed on the wafer 11.

The checking unit 78b is disposed above the chuck table 18 positioned in the coarse grinding station B. Described specifically, the checking unit 78b is disposed at a position that overlaps the holding surface of the chuck table 18 positioned in the coarse grinding station B and at a position that does not overlap the grinding wheel 38a. The checking unit 78b observes the wafer 11 which is under processing by the processing unit 32a and checks whether or not at least one metal electrode 19 is exposed on the wafer 11.

The checking unit 78c is disposed above the chuck table 18 positioned in the finish grinding station C. Described specifically, the checking unit 78c is disposed at a position that overlaps the holding surface of the chuck table 18 positioned in the finish grinding station C but does not overlap the grinding wheel 38b. The checking unit 78c observes the wafer 11 which is under processing by the processing unit 32b and checks whether or not at least one metal electrode 19 is exposed on the wafer 11.

The checking unit 78d is disposed on an upper end portion of the rinsing unit 72. When the wafer 11 is transferred from the rinsing unit 72 to the cassette 10 by the transfer unit 6, the wafer 11 passes below the checking unit 78d. While the wafer 11 is moving from the rinsing unit 72 toward the cassette 10, the checking unit 78d observes the wafer 11 held by the transfer unit 6 and checks whether or not at least one metal electrode 19 is exposed on the wafer 11.

Preferably, the checking units 78a and 78d can each observe the whole wafer 11. For example, the checking units 78a and 78d each includes a camera which can image the whole wafer 11. Owing to the inclusion of these cameras, it is possible to determine, with respect to the whole wafer 11 moving from the transfer station A toward the coarse grinding station B and the whole wafer 11 moving from the rinsing unit 72 toward the cassette 10, whether or not at least one metal electrode 19 is exposed. On the other hand, the checking units 78b and 78c each performs checking of the wafer 11 rotating together with the corresponding chuck table 18 during grinding. Therefore, the checking units 78b and 78c are each required to be able to observe only a portion of the wafer 11 (for example, a range corresponding to the radius of the wafer 11) held on the corresponding chuck table 18. By observing the wafers 11 with the checking units 78b and 78c while rotating the corresponding chuck tables 18, it is possible to determine, with respect to the whole wafer 11, whether or not at least one metal electrode 19 is exposed.

Preferably, the checking units 78a, 78b, and 78c may each be arranged outside the cover 68 as depicted in FIG. 2. By the cover 68, the processing fluid and swarf are hence suppressed from sticking the checking units 78a, 78b, and 78c. Here, the material of the cover 68 is appropriately selected so that the checking units 78a, 78b, and 78c can check the wafers 11 through the cover 68. For example, the cover 68 is formed with a transparent material (glass, plastic or the like). In a vicinity of the cover 68, rinsing units (rinsing means, not illustrated) may be arranged to rinse the cover 68 in regions where the cover 68 overlaps the checking units 78a, 78b, and 78c. As the rinsing units, it is possible to use, for example, rinsing brushes to rinse the cover 68, rinse fluid supply nozzles to supply a fluid (pure water or the like) for wash-away of foreign matter stuck on the cover 68, or the like. The accuracy of checking can be improved by rinsing the cover 68 with the rinsing units before the checking of the wafers 11 by the checking units 78a, 78b, and 78c is performed. However, the checking units 78a, 78b, and 78c may each be disposed inside the cover 68 (inside the opening 68b).

No limitations are imposed on the number and positions of checking units disposed in the wafer processing apparatus 2. For example, a checking unit may also be arranged between the cassette mounting table 4b and the registration mechanism 12 or above the registration mechanism 12. This checking unit performs checking of the wafer 11 in the course of transfer of the wafer 11 from the cassette 8 toward the registration mechanism 12 or when the wafer 11 has been placed on the registration mechanism 12. The checking unit can therefore prevent the wafer 11 with at least one metal electrode 19 exposed thereon from being transferred by the transfer unit 14 to cause sticking of the metal on the transfer unit 14 and the like.

Checking units may also be attached to distal end portions of the transfer unit 14 and the transfer unit 70, individually. If this is the case, when holding the wafer 11 by the transfer unit 14 or the transfer unit 70, checking of the wafer 11 can be performed.

A checking unit may also be arranged between the transfer station A and the polishing station D, or above the transfer station A. This checking unit performs checking of the wafer 11 in the course of movement of the wafer 11, to which polishing has been applied, from the polishing station D toward the transfer station A or when the wafer 11 has been positioned in the transfer station A. The checking unit can therefore prevent the wafer 11 with at least one metal electrode 19 exposed thereon from being transferred by the transfer unit 70 to cause sticking of the metal on the transfer unit 70 and the like.

In a vicinity of the rinsing unit 72, a checking unit may also be arranged to check the rinsed wafer 11. This checking unit includes a camera that can image, for example, a region of the wafer 11, where the wafer 11 has been processed, in its entirety, and images the processed region of the wafer 11 before the rinsed wafer 11 is accommodated in the cassette 10. An image of the wafer, which has been acquired by the imaging, can also be used to ascertain the size of a scratch occurred in the processed region by grinding and polishing.

Figure 3:
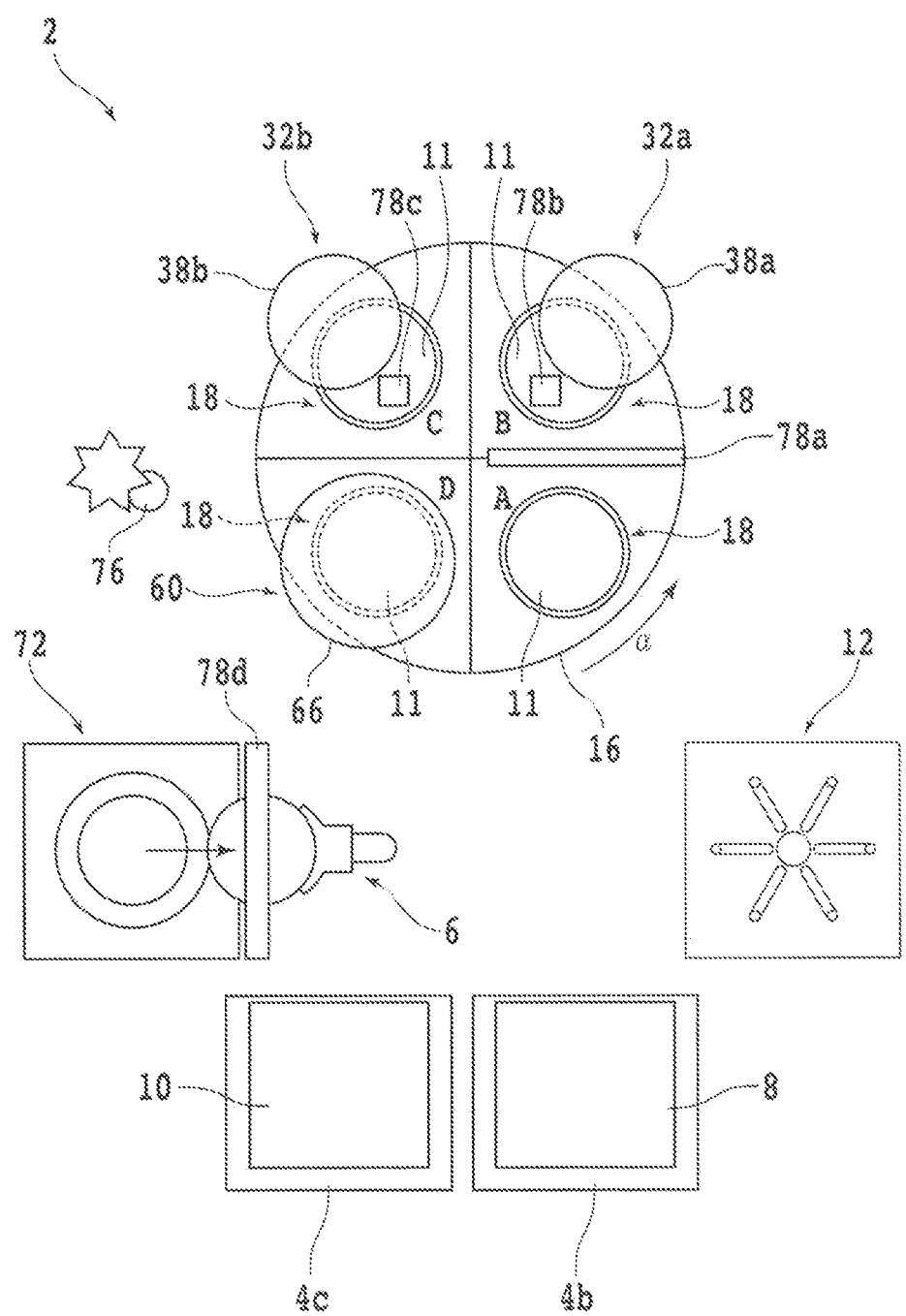
FIG. 3 is a plan view schematically depicting the wafer processing apparatus.

A description will next be made regarding a specific operation example of the wafer processing apparatus 2. FIG. 3 is a plan view schematically depicting the wafer processing apparatus 2. In FIG. 3, some of the constituent parts in the wafer processing apparatus 2 are not depicted.

First, from the cassette 8 placed on the cassette mounting table 4b, one of the wafers 11 is transferred to the registration mechanism 12 by the transfer unit 6, and an alignment of the wafer 11 is performed. Then, the wafer 11 is transferred by the transfer unit 14 (see FIG. 2) from the registration mechanism 12 onto the chuck table 18 positioned in the transfer station A, and the wafer 11 is held under suction by the chuck table 18.

Next, the turn table 16 is rotated to position the chuck table 18 with the wafer 11 held thereon in the coarse grinding station B. At this time, checking of the wafer 11, which is passing below the checking unit 78a, is performed by the checking unit 78a, whereby it is confirmed whether or not at least one metal electrode 19 is exposed on the wafer 11. The wafer 11 is then ground by the processing unit 32a until its thickness is reduced to a predetermined value (coarse grinding). While the processing by the processing unit 32a is under way, another one of the wafers 11 is transferred from the cassette 8 onto the chuck table 18 positioned in the transfer station A. During the grinding of the wafer 11 by the processing unit 32a, checking of the wafer 11 is performed by the checking unit 78b. Described specifically, an image of the whole wafer 11 is acquired by continuously imaging the wafer 11 with the camera included in the checking unit 78b while rotating the chuck table 18. Based on the image, it is then determined whether or not at least one metal electrode 19 is exposed.

Next, the turn table 16 is rotated to position, in the finish grinding station C, the chuck table 18 that holds the wafer 11 to which coarse grinding has been applied. The wafer 11 is then ground by the processing unit 32b until its thickness is reduced to a predetermined value (finish grinding). While the processing by the processing unit 32b is under way, the wafer 11 held by the chuck table 18 positioned in the coarse grinding station B is ground by the processing unit 32a, and, in addition, a further one of the wafers 11 is transferred from the cassette 8 onto the chuck table 18 positioned in the transfer station A. During the grinding of the wafer 11 by the processing unit 32b, checking of the wafer 11 is performed by the checking unit 78c. Described specifically, an image of the whole wafer 11 is acquired by continuously imaging the wafer 11 with the camera included in the checking unit 78c while rotating the chuck table 18. Based on the image, it is then determined whether or not at least one metal electrode 19 is exposed.

Next, the turn table 16 is rotated to position, in the polishing station D, the chuck table 18 that holds the wafer 11 to which finish grinding has been applied. The wafer 11 is then polished by the processing unit 60 until its thickness is reduced to a predetermined value. While the processing by the processing unit 60 is under way, the wafers 11 held by the chuck tables 18 positioned in the coarse grinding station B and the finish grinding station C are ground by the processing units 32a and 32b, respectively. In addition, a still further one of the wafers 11 is transferred from the cassette 8 onto the chuck table 18 positioned in the transfer station A.

Next, the turn table 16 is rotated to position, in the transfer station A, the chuck table 18 that holds the wafer 11 to which polishing has been applied. The wafer 11 positioned in the transfer station A is then transferred by the transfer unit 70 (see FIG. 2) to the rinsing unit 72, where the wafer 11 is rinsed. At this time, the wafers 11 held by the chuck tables 18 positioned in the coarse grinding station B and the finish grinding station C are ground by the processing units 32a and 32b, respectively. Further, the wafer 11 held by the chuck table 18 positioned in the polishing station D is polished by the processing unit 60.

After the rinsing of the wafer 11 has been performed by the rinsing unit 72, the wafer 11 is transferred to the cassette 10 by the transfer unit 6. When the wafer 11 is transferred from the rinsing unit 72, the wafer 11 passes below the checking unit 78d in a state of being held by the transfer unit 6. At this time, checking of the wafer 11 is performed by the checking unit 78d to confirm whether or not at least one metal electrode 19 is exposed on the wafer 11. The wafer 11 is then accommodated in the cassette 10 by the transfer unit 6.

If it is detected by one of the checking units 78a, 78b, 78c, and 78d at any time between the unloading of the wafer 11 from the cassette 8 and its loading in the cassette 10 that at least one metal electrode 19 is exposed on the wafer 11, the control unit 74 discontinues the operation of the wafer processing apparatus 2. Therefore, the metal that constitutes the at least one metal electrode 19 is suppressed from scattering and spreading inside the wafer processing apparatus 2. In addition, the notification unit 76 notifies that at least one metal electrode 19 is exposed on the wafer 11 (for example, lighting of an alarm lamp). Therefore, the operator can recognize that at least one metal electrode 19 is exposed on the wafer 11 which is under processing in the wafer processing apparatus 2.

A description will next be made regarding a specific example of a method for processing the wafers 11 by using the wafer processing apparatus 2. Here, the description will be made regarding processing that applies grinding and polishing to the back side 11b of the wafer 11 depicted in FIGS. 1A and 1B and thins the wafer 11 until shortly before at least one metal electrode 19 is exposed on the side of the back side 11b of the wafer 11.

Figure 4A:
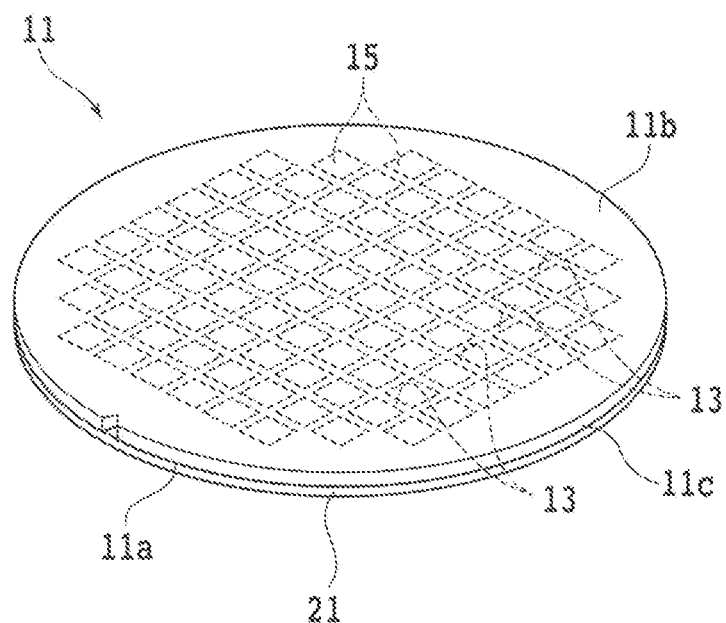
FIG. 4A is a perspective view depicting the wafer with a protection member bonded thereon.
Figure 4B:
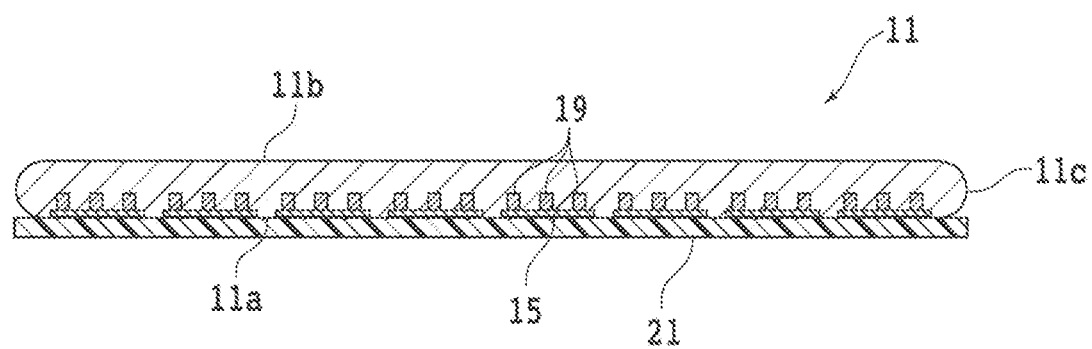
FIG. 4B is a cross-sectional view depicting the wafer with the protection member bonded thereon.

When processing the wafer 11 by the wafer processing apparatus 2, a protection member (protection sheet) 21 is first bonded to the front side 11a of the wafer 11. FIG. 4A is a perspective view depicting the wafer 11 with the protection member 21 bonded thereon, and FIG. 4B is a cross-sectional view depicting the wafer 11 with the protection member 21 bonded thereon. As the protection member 21, a film-shaped tape made of a resin or the like and formed in a circular shape of substantially the same diameter as the wafer 11 may be used, for example. By the protection member 21, the devices 15 formed on the front side 11a of the wafer 11 are covered and protected.

Figure 5:
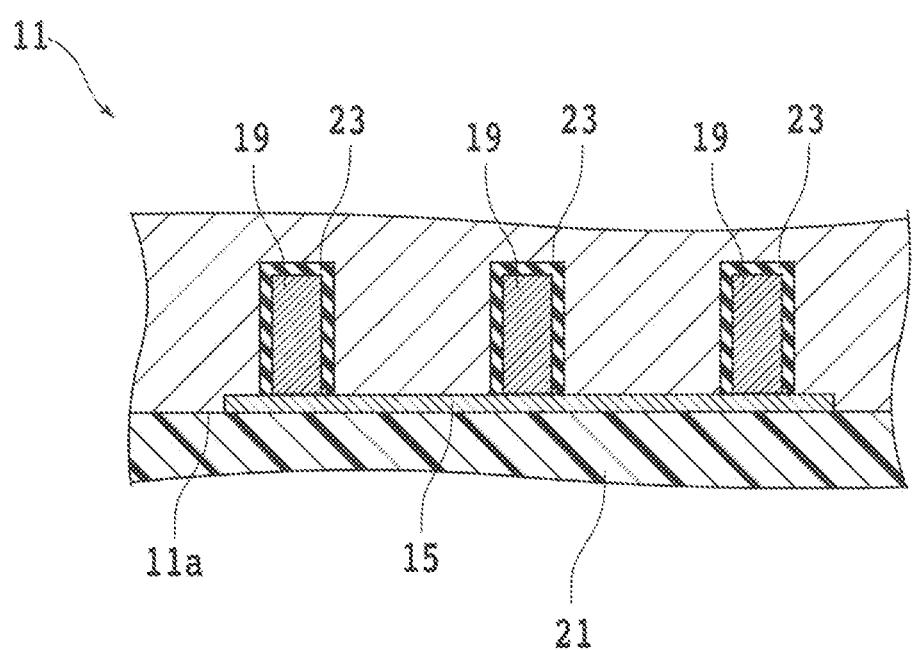
FIG. 5 is a cross-sectional view depicting a portion of the wafer on an enlarged scale.

FIG. 5 is a cross-sectional view depicting a portion of the wafer 11 on an enlarged scale. In the wafer 11, the metal electrodes 19 connected to the device 15 are embedded. Between the metal electrodes 19 and the wafer 11, insulating layers 23 are formed so that the metal electrodes 19 are covered by the insulating layers 23. By the insulating layers 23, the wafer 11 and the metal electrodes 19 are insulated from each other. The insulating layers 23 are each configured by an insulating film made, for example, of silicon oxide or the like formed using a thermal oxidation process or a chemical vapor deposition (CVD) process. The insulating layers 23 may each be configured by stacking a plurality of insulating films.

Using the wafer processing apparatus 2, grinding and polishing is next applied to the back side 11b of the wafer 11. Details of the processing of the wafer 11 by the wafer processing apparatus 2 are as described above. When grinding and polishing the wafer 11 on the back side 11b thereof, the wafer 11 is placed on the chuck table 18 (see FIGS. 2 and 3) so that the front side 11a faces the holding surface of the chuck table 18 and the back side 11b is exposed facing upward. Described specifically, the wafer 11 is first ground on the back side 11b thereof by the processing unit 32a to perform coarse grinding of the wafer 11. Subsequently, the wafer 11 is ground on the back side 11b thereof by the processing unit 32b to perform finish grinding of the wafer 11. The wafer 11 is then polished on the back side 11b thereof by the processing unit 60.

Figure 6:
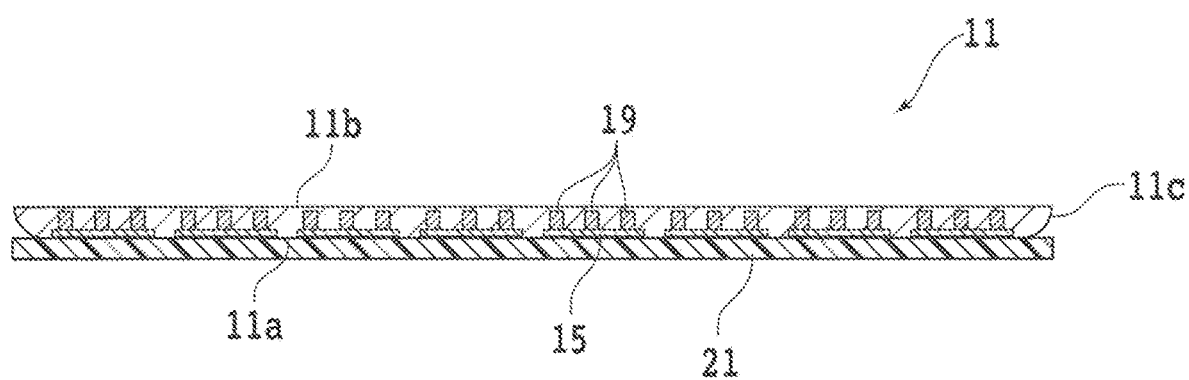
FIG. 6 is a cross-sectional view similar to FIG. 4B and depicts the wafer after processing.

FIG. 6 is a cross-sectional view similar to FIG. 4B and depicts the wafer 11 after the processing. The amount of grinding of the wafer 11 by the processing units 32a and 32b and the amount of polishing of the wafer 11 by the processing unit 60 are set within ranges in which the metal electrodes 19 will not be exposed on the back side 11b of the wafer 11. It is, therefore, possible to avoid grinding or polishing of one or more of the metal electrodes 19 and to prevent the metal, which constitutes the one or more metal electrodes 19, from scattering and sticking the wafer and the interior of the wafer processing apparatus 2. After processing the wafer 11 by the wafer processing apparatus 2, plasma etching or the like is applied to the back side 11b of the wafer 11 so that the metal electrodes 19 are exposed from the back side 11b of the wafer 11. As a consequence, via electrodes (through electrodes) are formed to connect the devices 15 to other devices or the like.

Figure 7:
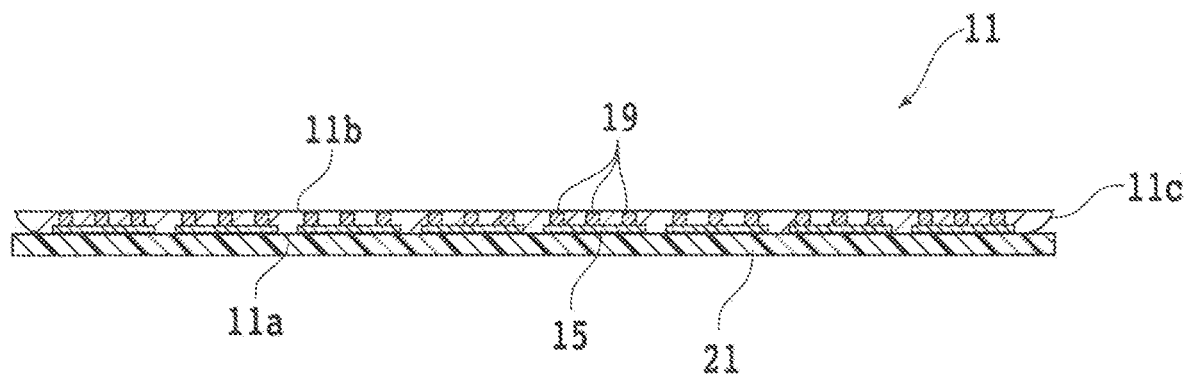
FIG. 7 is a cross-sectional view similar to FIG. 6 and depicts a wafer with metal electrodes exposed.

Due to variations in the processing of the wafer 11 by the processing units 32a and 32b and the processing unit 60, however, the wafer 11 may be ground or polished more than a preset value. As a result, one or more of the metal electrodes 19 embedded in the wafer 11 may be unintentionally exposed on the back side 11b of the wafer 11 during the processing of the wafer 11 by the wafer processing apparatus 2. FIG. 7 is a cross-sectional view similar to FIG. 6 and depicts the wafer 11 with the metal electrodes 19 exposed. The checking units 78a, 78b, 78c, and 78d (see FIGS. 2 and 3) included in the wafer processing apparatus 2 check whether or not at least one metal electrode 19 is exposed on the back side 11b of the wafer 11 as depicted in FIG. 7. Here, it is to be noted that in FIG. 7, the metal electrodes 19 formed along a particular single street are all exposed on the back side 11b of the wafer 11. If it is detected by any one of the checking units 78a, 78b, 78c, and 78d that at least one metal electrode 19 is exposed, the control unit 74 (see FIG. 2) immediately discontinues the operation of the wafer processing apparatus 2.

As described above, the wafer processing apparatus 2 according to the present embodiment includes the checking units 78a, 78b, 78c, and 78d that check whether or not at least one metal electrode 19 is exposed on the wafer 11, and the control unit 74 that controls the operations of the constituent parts (the processing units, the transfer units and the like) of the wafer processing apparatus 2. If the exposure of at least one metal electrode 19 on the wafer 11 is detected by any one of the checking units 78a, 78b, 78c, and 78d, the control unit 74 stops the processing, transfer or the like by each constituent part of the wafer processing apparatus 2. The use of the above-described wafer processing apparatus 2 can suppress scattering of the metal, which constitutes the at least one metal electrode 19, and spreading of the metal inside the wafer processing apparatus 2 even if the at least one metal electrode 19 is unintentionally exposed on the wafer 11 by the processing of the wafer 11. Therefore, contamination of the wafer 11 and the wafer processing apparatus 2 is prevented, and the labor and cost required the maintenance (overhaul and the like) of the wafer processing apparatus 2 are reduced.

In the foregoing, the description is made regarding the embodiment in which as an example, checking is made as to whether or not at least one of the metal electrodes 19 connected to the devices 15 embedded in the wafer 11 is exposed on the back side 11b of the wafer 11. However, no limitation is imposed on the structure of the wafer 11, and the wafer processing apparatus 2 may also be used to process other wafers with potential exposure of one or more metal electrodes when grinding or polishing is applied.

Furthermore, the configuration, method and the like of the present embodiment can be practiced with changes or alterations as needed to such extent as not departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing apparatus comprising:
   a chuck table that holds one of a plurality of wafers in each of which metal electrodes are embedded;
   a processing unit that grinds or polishes the wafer held by the chuck table;
   a cassette mounting table on which a cassette, in which the plurality of wafers is capable of being accommodated, is mounted;

a transfer unit that holds and transfers each wafer between the cassette and the chuck table;

a checking unit configured to check whether or not at least one of the metal electrodes is exposed on the wafer;

a notification unit that notifies that the at least one metal electrode is exposed; and a control unit that controls operations of the processing unit and the transfer unit, wherein the control unit is configured so that, if the exposure of the at least one metal electrode on the wafer is detected by the checking unit, the control unit stops the processing of the wafer by the processing unit and the transfer of the wafer by the transfer unit and controls the notification unit to notify the exposure of the at least one metal electrode on the wafer.

2. The wafer processing apparatus according to claim 1, wherein the checking unit is configured to check the wafer held by the chuck table.

3. The wafer processing apparatus according to claim 1, wherein the checking unit is configured to check the wafer held by the transfer unit.

4. A wafer processing apparatus comprising:

a chuck table that holds one of a plurality of wafers in each of which metal electrodes are embedded;

a processing unit that grinds or polishes the wafer held by the chuck table;

a cassette mounting table on which a cassette, in which the plurality of wafers is capable of being accommodated, is mounted;

a transfer unit that holds and transfers each wafer between the cassette and the chuck table;

a checking unit configured to check whether or not at least one of the metal electrodes is exposed on the wafer;

a notification unit that notifies that the at least one metal electrode is exposed; and a control unit that controls operations of the processing unit and the transfer unit, wherein the control unit is configured so that, if the exposure of the at least one metal electrode on the wafer is detected by the checking unit, the control unit stops the processing of the wafer by the processing unit and the transfer of the wafer by the transfer unit and controls the notification unit to notify the exposure of the at least one metal electrode on the wafer, and wherein the wafer processing unit further comprises:
a determination unit,
wherein the checking unit is connected to the determination unit and includes a camera configured to image the wafer, and
further wherein the determination unit is configured to determine, based on an image of the wafer as acquired by the camera, whether or not the at least one metal electrode is exposed.

5. The wafer processing apparatus according to claim 4, wherein the checking unit is configured to check the wafer held by the chuck table.

6. The wafer processing apparatus according to claim 4, wherein the checking unit is configured to check the wafer held by the transfer unit.

7. The wafer processing apparatus according to claim 4, wherein the determination unit applies image processing on the image, based on a difference in density between an area of the wafer without a metal wafer and an area where the at least one metal wafer is exposed, to determine whether or not the at least one metal electrode is exposed.

8. The wafer processing apparatus according to claim 4, wherein the determination unit binarizes the image into white pixels and black pixels to determine whether or not the at least one metal electrode is exposed.

9. The wafer processing apparatus according to claim 4, wherein the determination unit makes the density of the image multivalued, and compares gradations within the image to a preset threshold value to determine whether or not the at least one metal electrode is exposed.

10. The wafer processing apparatus according to claim 4, wherein the determination unit applies first light rays of a first wavelength and second light rays of a second wavelength to the wafer when imaging the wafer with the camera, where the first wavelength is different from the second wavelength, to determine whether or not the at least one metal electrode is exposed.

11. The wafer processing apparatus according to claim 4, wherein the determination unit applies pattern matching on the image to compare the image with a reference image of a wafer without any exposed metal electrodes to determine whether or not the at least one metal electrode is exposed.

12. A wafer processing apparatus comprising:

a chuck table that holds one of a plurality of wafers in each of which metal electrodes are embedded;

a processing unit that grinds or polishes the wafer held by the chuck table;

a cassette mounting table on which a cassette, in which the plurality of wafers is capable of being accommodated, is mounted;

a transfer unit that holds and transfers each wafer between the cassette and the chuck table;

a checking unit configured to check whether or not at least one of the metal electrodes is exposed on the wafer;

a notification unit that notifies that the at least one metal electrode is exposed; and a control unit that controls operations of the processing unit and the transfer unit, wherein the control unit is configured so that, if the exposure of the at least one metal electrode on the wafer is detected by the checking unit, the control unit stops the processing of the wafer by the processing unit and the transfer of the wafer by the transfer unit and controls the notification unit to notify the exposure of the at least one metal electrode on the wafer, and wherein the wafer processing unit further comprises:
a determination unit,
wherein the checking unit is connected to the determination unit and further wherein the checking unit is configured and arranged to irradiate a laser beam towards the wafer, and
further wherein the determination unit is configured to determine, based on a difference between an intensity of the laser beam reflected by the wafer and an intensity of the laser beam reflected by one of the metal electrodes, whether or not the at least one metal electrode is exposed.

13. The wafer processing apparatus according to claim 12, wherein the checking unit is configured to check the wafer held by the chuck table.

14. The wafer processing apparatus according to claim 12, wherein the checking unit is configured to check the wafer held by the transfer unit.

* * * * *